(12) United States Patent
Waltari et al.

(10) Patent No.: US 9,035,810 B1
(45) Date of Patent: May 19, 2015

(54) SYSTEM AND METHOD FOR DIGITAL-TO-ANALOG CONVERTER CALIBRATION

(71) Applicant: IQ-Analog Corporation, San Diego, CA (US)

(72) Inventors: Mikko Waltari, Escondido, CA (US); Costantino Pala, San Diego, CA (US)

(73) Assignee: IQ—Analog Corporation, San Diego, CA (US)

( * ) Notice: Subject to any disclaimer, the term of this patent is extended or adjusted under 35 U.S.C. 154(b) by 0 days.

(21) Appl. No.: 14/602,095

(22) Filed: Jan. 21, 2015

(51) Int. Cl.
*H03M 1/10* (2006.01)
*H03M 1/68* (2006.01)
*H03M 1/66* (2006.01)

(52) U.S. Cl.
CPC .......... *H03M 1/1019* (2013.01); *H03M 1/1095* (2013.01); *H03M 1/687* (2013.01); *H03M 1/665* (2013.01)

(58) Field of Classification Search
CPC ......... H03M 1/00; H03M 1/12; H03M 1/747; H03M 2201/63; H03M 1/1019; H03M 1/742; H03M 1/1009; H03M 1/687; H03M 1/745; H03M 2201/192
USPC .................. 341/118, 120, 121, 158
See application file for complete search history.

(56) References Cited

U.S. PATENT DOCUMENTS

| | | | | |
|---|---|---|---|---|
| 5,283,582 A | * | 2/1994 | Krenik | 341/158 |
| 6,130,632 A | * | 10/2000 | Opris | 341/120 |
| 6,331,830 B1 | * | 12/2001 | Song et al. | 341/121 |
| 6,738,006 B1 | * | 5/2004 | Mercer et al. | 341/144 |
| 7,076,384 B1 | * | 7/2006 | Radulov et al. | 702/85 |
| 7,341,374 B2 | * | 3/2008 | Chiu | 374/1 |
| 2003/0227402 A1 | * | 12/2003 | Starzyk et al. | 341/144 |

OTHER PUBLICATIONS

T. Chen et al., "A 14-bit 200-MHz current-steering DAC with switching-sequence post-adjustment calibration," IEEE J. Solid-State Circuits, vol. 42, No. 11, pp. 2386-2394.

Y. Cong and R. L. Geiger, "A 1.5-V 14-bit 100-MS/s self-calibrated DAC," IEEE J. Solid-State Circuits, vol. 38, No. 12, pp. 2051-2060, Dec. 2003.

(Continued)

*Primary Examiner* — Jean B Jeanglaude
(74) *Attorney, Agent, or Firm* — Law Office of Gerald Maliszewski; Gerald Maliszewski

(57) ABSTRACT

A system and method are provided for measuring current sources, such as might be useful in the calibration of a digital-to-analog converter (DAC). The method provides a first plurality of current sources. Each current source is engageable to supply a current representing a corresponding nominal value. The method selectively enables current source combinations of current. In response to measuring the current source combinations, current difference values are found, and the current source nominal values are adjusted using the current difference values. In one aspect, a reference current source is provided having a reference first value, and the current source nominal values are adjusted with respect to the reference first value. The current sources may have corresponding nominal digital values adjusted using measured digital difference values.

22 Claims, 11 Drawing Sheets

(56) References Cited

OTHER PUBLICATIONS

J. Hyde et al., "300MS/s 14-bit digital-to-analog converter in logic CMOS," IEEE Journal of Solid-State Circuits, vol. 38, No. 5, pp. 734-740, May 2003.

H. H, Chen et al., "A 14-b 150 MS/s CMOS DAC with Digital Background Calibration," Digest of Technical Papers, 2006 Symposium on VLSI Circuits, pp. 51-52.

* cited by examiner

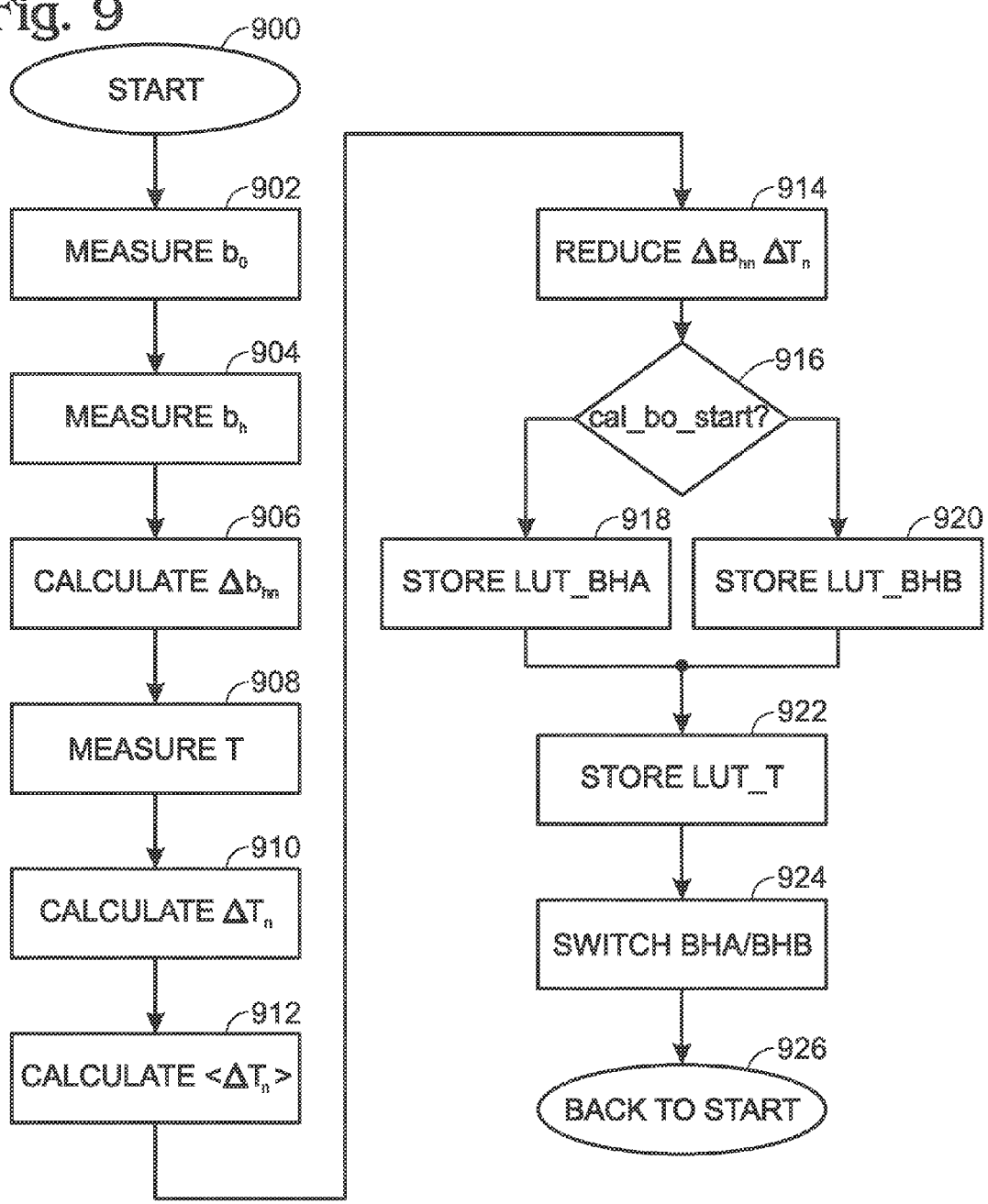

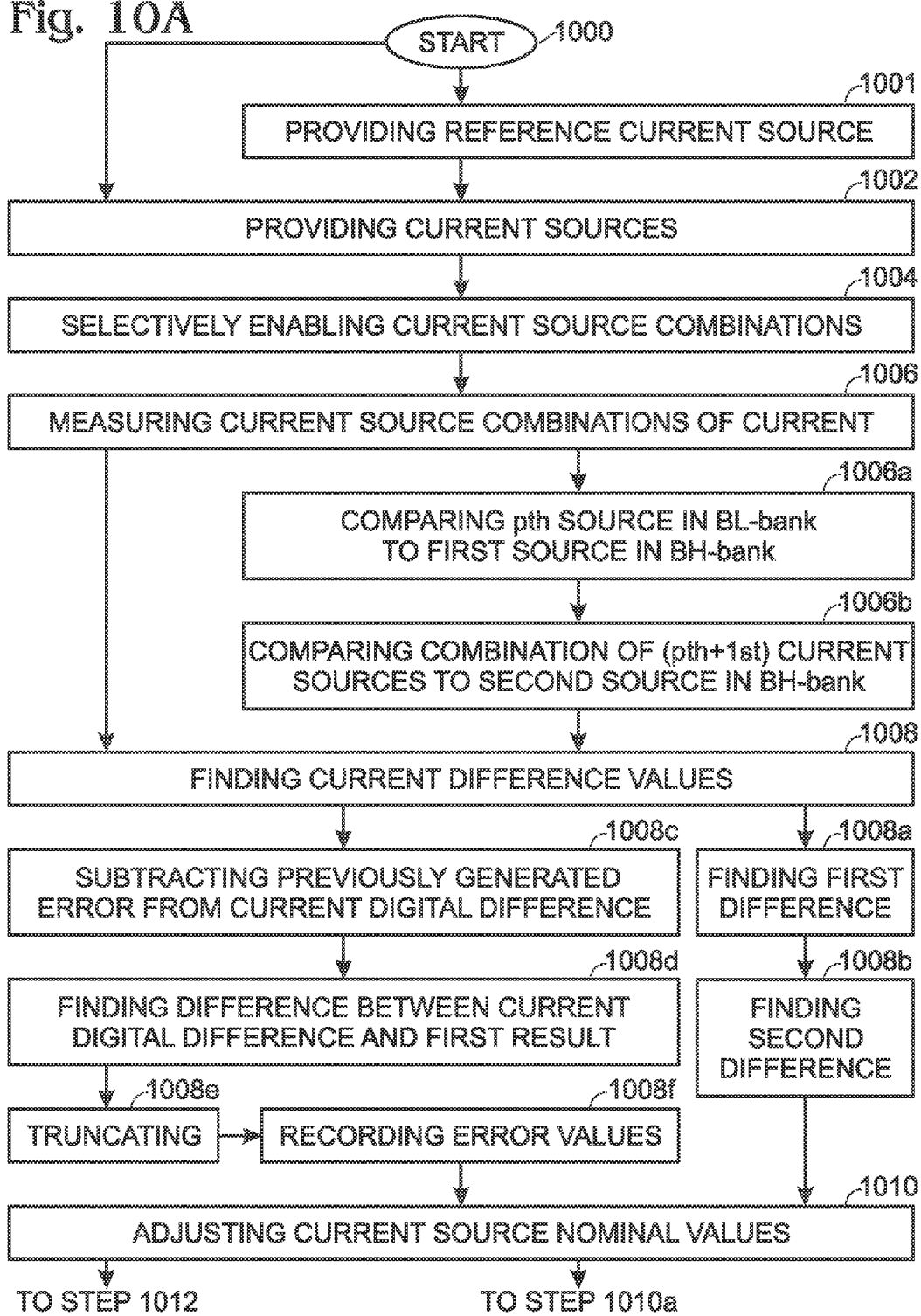

SYSTEM AND METHOD FOR DIGITAL-TO-ANALOG CONVERTER CALIBRATION

BACKGROUND OF THE INVENTION

1. Field of the Invention

This invention generally relates to digital-to-analog converters (DACs) and, more particularly, a system and method for calibrating a DAC.

2. Description of the Related Art

A current-steering uses DAC uses a number of current sources (CS) whose currents are switched to a summing node. The current sum is an analog value that is intended to represent a digital value input to the DAC. In a differential current-steering DAC, separate currents for each CS are switched to positive and negative summing nodes.

A thermometer-coded DAC contains a current-source segment for each possible value of DAC output. An 8-bit thermometer DAC would have 255 segments, and a 16-bit thermometer DAC would have 65,535 segments. This is one of the fastest digital-to-analog conversion methods but suffers of low precision due to the accuracy requirements for each current source. To achieve higher accuracy a technique called "segmentation" is often used, i.e. the current sources are divided in two "segments", the least-significant bits (LSBs) that are typically binary scaled, and the most-significant thermometer-coded bits that are typically twice the largest LSB. In this way, a compromise is obtained between precision (by the use of the thermometer-coded principle) and number of current sources (by the use of the binary-weighted principle). In order to achieve the desired output resolution, the current sources must have exact ratios. If their ratios are not exact (e.g. the current sources are "mismatched"), the DAC suffers from a lower effective resolution than nominal.

There are few methods known to mitigate the issues associated with DAC calibration. The current sources can be increased in size to improve matching. However, this solution requires that the DAC device becomes bigger (and more expensive), and the internal signals must travel a longer distance, thus limiting the maximum speed. Calibration switches can be added to equalize the size of the current sources. Again however, this solution results in a larger DAC device, and the calibration switches add extra complexity. Analog calibration can also be implemented by using capacitors to store a calibration charge. As in the solutions above, the DAC device becomes bigger due to the extra area for the capacitors and switches. Moreover, the analog complexity is also increased. Calibration can also be performed digitally. However, this solution requires the use of an analog-to-digital converter (ADC), which must have the same analog input dynamic range as the DAC itself, which results in complicated analog circuitry.

It would be advantageous if a DAC could be calibrated using a low dynamic range ADC by comparing all the current sources to a single reference.

It would be advantageous if the DAC current sources could be compared to the single reference by recording the differences between adjacent current sources.

SUMMARY OF THE INVENTION

Disclosed herein are a system and method for calibration that minimizes the analog complexity of a current-steering digital-to-analog converter (DAC) and improves resolution.

Accordingly, a method is provided for measuring current sources. The method provides a first plurality of current sources. Each current source is engageable to supply a current representing a corresponding nominal value. The method selectively enables current source combinations of current. In response to measuring the current source combinations, current difference values are found, and the current source nominal values are adjusted using the current difference values.

The method may provide a reference current source having a reference first value. Then, at least a first current source is compared to the reference current source, and the current source nominal values are adjusted with respect to the reference first value. In one aspect, the current sources have corresponding nominal digital values. Then, the current difference values are converted into digital difference values, and the current source nominal digital values are adjusted using the digital difference values.

In one aspect, the plurality of current sources includes a lower bank of p current sources (BL-bank) having corresponding consecutively increasing reference digital values ending with a pth current source having a reference first digital value. A higher bank of q current sources (BH-bank) has corresponding consecutively increasing nominal digital values beginning with a first digital value nominally equal to the reference first digital value.

Then, the step of measuring current source combinations may be as follows. In a first comparison, the pth current source in the BL-bank is compared to a first current source in the BH-bank having the nominal first digital value. In a second comparison, the combination of (the pth current source and the first current source) is compared to a second current source in the BH-bank having a second digital value nominally equal to (the reference first digital value and the nominal first digital value). A first digital difference is found in response to the first comparison, and a second digital difference is found in response to the second comparison. Then, the nominal digital value of the first current source (in the BH-bank) is adjusted in response to the first digital difference, and the nominal digital value of the second current source is adjusted in response to the first and second digital differences. The same principle of finding differences and adjusting nominal values can be applied to current sources in a thermometer bank (T-bank), where each current source in the T-bank has a nominal nth digital value.

The method may also include the step of accepting a digital word having an input digital word value. As a result of selecting a combination of current sources from the BL-bank, BH-bank, and T-bank having an adjusted digital word value equal to the input digital word value, a calibrated output analog current is supplied.

In another aspect, a dedicated offset current source, which is not used to supply analog current matching an input digital word, is used to provide the reference first digital value. In this aspect, two parallel BH-banks may also be provided. A first higher bank of q current sources (BH1-bank) has corresponding consecutively increasing nominal digital values beginning with the first digital value nominally equal to the reference first digital value. Likewise, a second higher bank of q current sources (BH2-bank) has corresponding consecutively increasing nominal digital values beginning with the first digital value nominally equal to the reference first digital value. Also in this aspect, the T-bank has an "extra" (e.g. (m+1)) current sources each having the nominal nth digital value.

Then, in response to receiving a digital word for conversion to an analog value, current sources may be selected from the BL-bank, the BH1-bank, and m current sources from the T-bank to form the adjusted digital word value equal to the input digital word value. Simultaneously with forming the adjusted digital word value, combinations of the offset current source, BH2-bank current sources, and one selectively rotated current source from the T-bank may be compared as part of a background calibration process that adjusts current source nominal values in the BH2-bank and the selected current source in the T-bank.

Additional details of the above-described method and a system for measuring current sources are provided below.

BRIEF DESCRIPTION OF THE DRAWINGS

FIG. 9 is a flowchart illustrating the DAC calibration process.

FIGS. 10A and 10B are a flowchart illustrating a method for measuring current sources.

DETAILED DESCRIPTION

Figure 1:
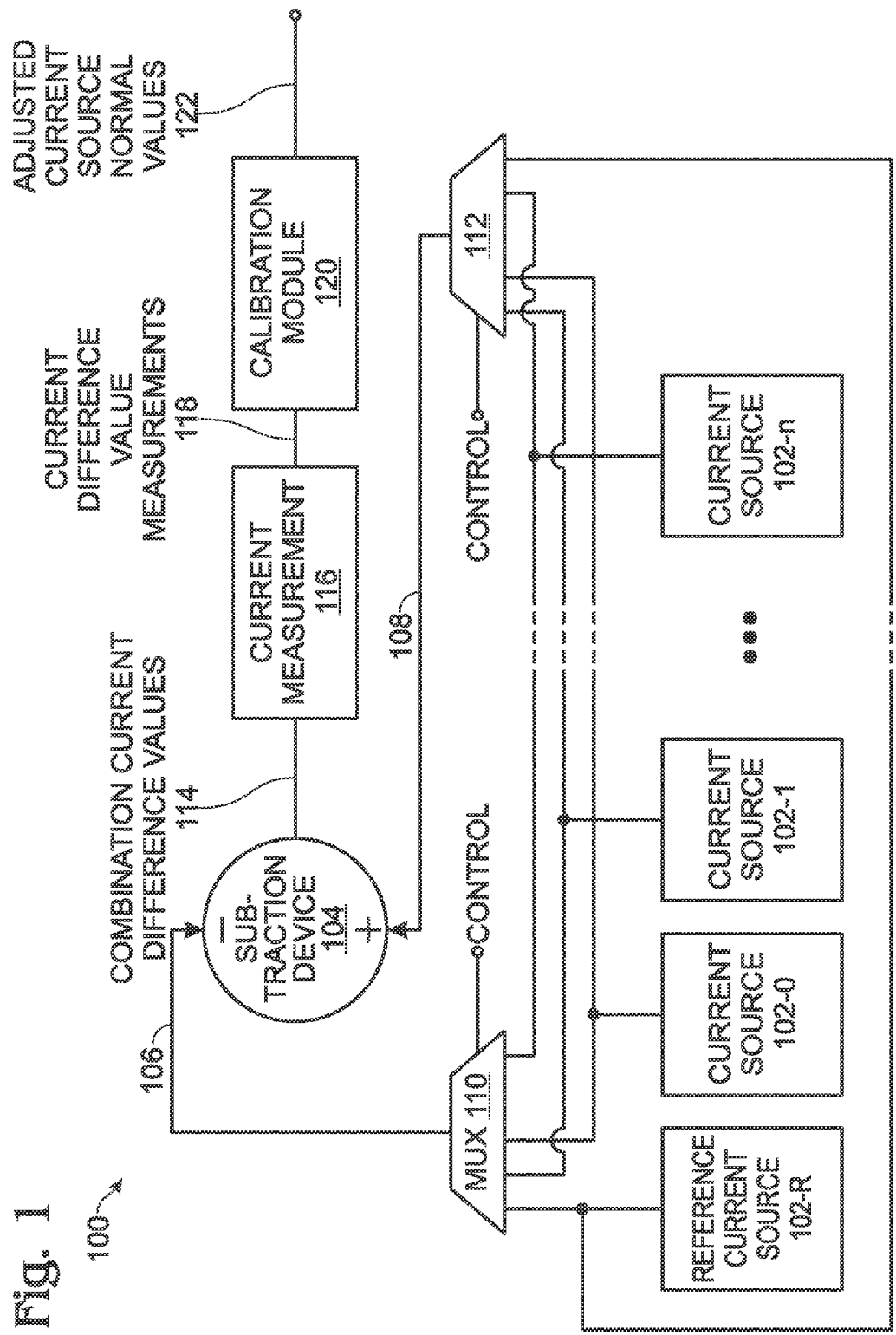
FIG. 1 is a schematic block diagram depicting a system for measuring current sources.

FIG. 1 is a schematic block diagram depicting a system for measuring current sources. The system 100 comprises a first plurality of current sources 102-0 through 102-$n$, where n is a positive integer greater than 1. Each current source is engageable to supply a current representing a corresponding nominal value. A subtraction device 104 has inputs on lines 106 and 108 selectively connected to the current sources 102-0 through 102-$n$. Here, the selective connections between the current sources and the subtraction device are shown enabled using multiplexers (MUXs) 110 and 112. For simplicity, the MUXs are assumed to have the capability of summing a plurality input signals, which sum is provided as an output signal, in response to control signals. However, the system is not limited to any particular means of connecting and combining current sources. The subtraction device 104 has an output on line 114 to supply combination current difference values.

A current measurement device 116 has an input on line 114 to accept the combination current difference values and an output on line 118 to supply current difference value measurements. A calibration module 120 has an input on line 118 to accept the current difference value measurements and an output on line 122 to supply adjusted current source nominal values in response to the current difference value measurements. Here, the current difference value measurements and the adjusted current source nominal values may be in either the analog or digital domain. Further, the current difference value measurements may be in a different domain (either digital or analog) than the domain of the adjusted current source nominal values.

In one aspect as shown, the first plurality of current sources may include a reference current source 102-R having a reference first value. The current measurement device compares at least a first current source (e.g., current source 102-0) to the reference current source 102-R. The calibration module 120 adjusts the current source nominal values with respect to the reference first value. For example, the current measurement device 116 might be an analog current meter. If the difference in current between current source 102-0 and the reference current source 102-R is supposed to be 0.1 milliamps (mA), but is actually measured to be 0.09 mA, then the adjusted current source nominal value on line 122 might be a current (i.e. 0.01 mA) needed to make current supplied by current source 102-0 match its nominal value. As explained below, the current difference value measurements and adjusted current source nominal values may be expressed as digital values.

Figure 2:
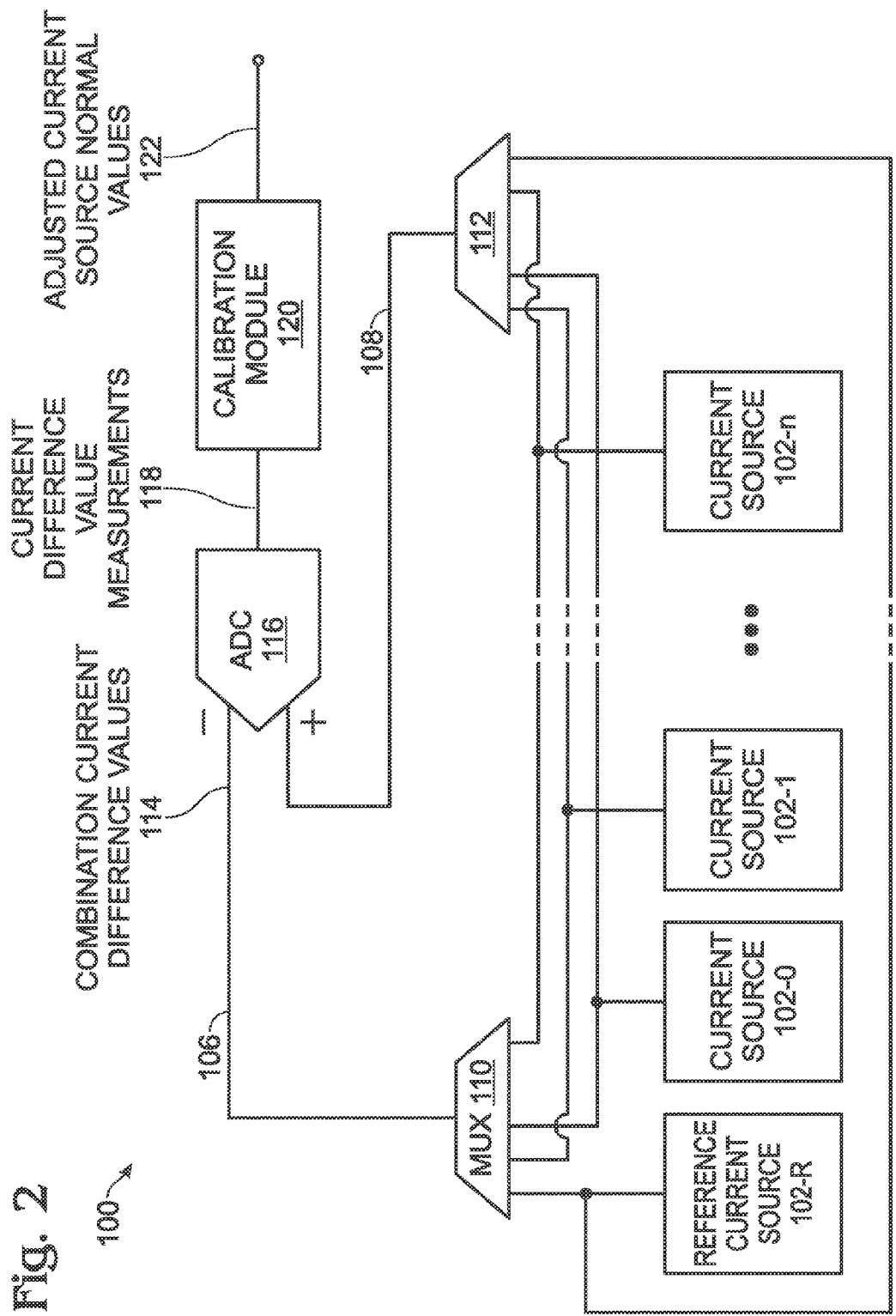
FIG. 2 is a schematic block diagram depicting a first variation of the system of FIG. 1.

FIG. 2 is a schematic block diagram depicting a first variation of the system of FIG. 1. In this aspect, the current sources have corresponding nominal digital values, and the current measurement device is an analog-to-digital converter (ADC) 116 that converts the current difference value measurements into digital difference values. For example, current sources 102-R and 102-0 may have a nominal digital value of 1, and current source 102-1 may have a nominal digital value of 2. In this aspect, the subtraction device may be enabled as positive and negative (differential) inputs to the ADC 116 on lines 106 and 108. Then, the calibration module 120 adjusts the current source nominal digital values using the digital difference values. For example, if the difference in current between current source 102-0 and the reference current source 102-R is supposed to be 0.0 milliamps (mA), but is actually measured to be 0.09 mA, then the adjusted current source nominal value on line 122 might be the reassignment of a new nominal current value (i.e. first reference value+0.09 mA) to current source 102-0. Alternatively, the adjusted current source nominal value may be the value that compensates for inaccuracies in the nominal value.

Figure 3:
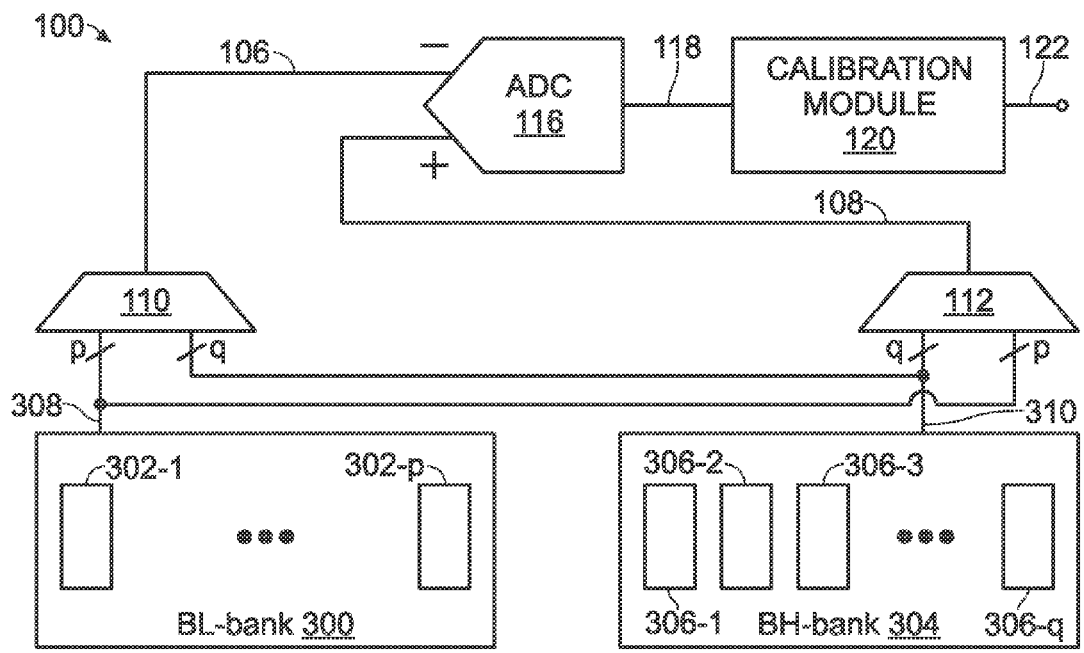
FIG. 3 is a schematic block diagram depicting a second variation of the system of FIG. 1.

FIG. 3 is a schematic block diagram depicting a second variation of the system of FIG. 1. In this aspect, the plurality of current sources includes a lower bank (BL-bank) 300 of p current sources (302-1 through 302-$p$) having corresponding consecutively increasing reference digital values ending with a pth current source (302-$p$), which has a reference first digital value. One example of consecutively increasing reference digital values is: 2, 4, 8 . . . . A higher bank (BH-bank) 304 of q current sources (306-1 through 306-$q$) has corresponding consecutively increasing nominal digital values beginning with a first digital value (306-1) nominally equal to the reference first digital value. Typically, the nominal digital value of a current source in the BH-bank is equal to the sum of the nominal digital values of the lower order current sources in the BH-bank, plus the reference first digital value. The selective connection of the current sources 302-1 through 302-$p$ and current sources 306-1 and 306-$q$ is again shown as being enabled using MUXs 110 and 112. For simplicity, a single line 308 is shown connecting the BL-bank 300 to MUX 110 and MUX 112. However, it should be understood that this line 308 is intended to represent a line between each current source (302-1 through 302-$p$) in the BL-bank and the MUXs 110 and 112. Likewise, line 310 is intended to represent a line between each current source 306-1 through 306-q in the BH-bank 304 and MUXs 110 and 112.

Again the subtraction device of FIG. 1 may be enabled in FIG. 3 with the use of an ADC having differential inputs on lines 106 and 108. The calibration process may begin with the subtraction (line 106) of the pth current source 302-p in the BL-bank 300 from a first current source 306-1 in the BH-bank 304 having the nominal first digital value in a first comparison. In a second comparison, the combination of (the pth current source 302-p and the first current source 306-1) may be subtracted (line 106) from a second current source in the BH-bank (306-2) having a second digital value nominally equal to (the reference first digital value+the nominal first digital value), which is 2× the nominal first digital value.

In this scenario, the ADC 116 supplies a first digital difference in response to the first comparison, and supplies a second digital difference in response to the second comparison. The calibration module 120 adjusts the nominal digital value of the first current source in response to the first digital difference, and adjusts the nominal digital value of the second current source in response to the first and second digital differences. Likewise, the combination of current sources 302-p, 306-1, and 306-2 may be combined, and compared to current source 302-3, assuming that the nominal digital value of 306-3 is equal to (the reference first digital value+nominal first digital value+nominal second digital value). Current sources in the BL-bank may be calibrated in a similar manner. However, as explained in more detail below, the BL-bank current sources may be of a larger size, and being inherently more accurate, do not require the same type of calibration process.

Figure 4:
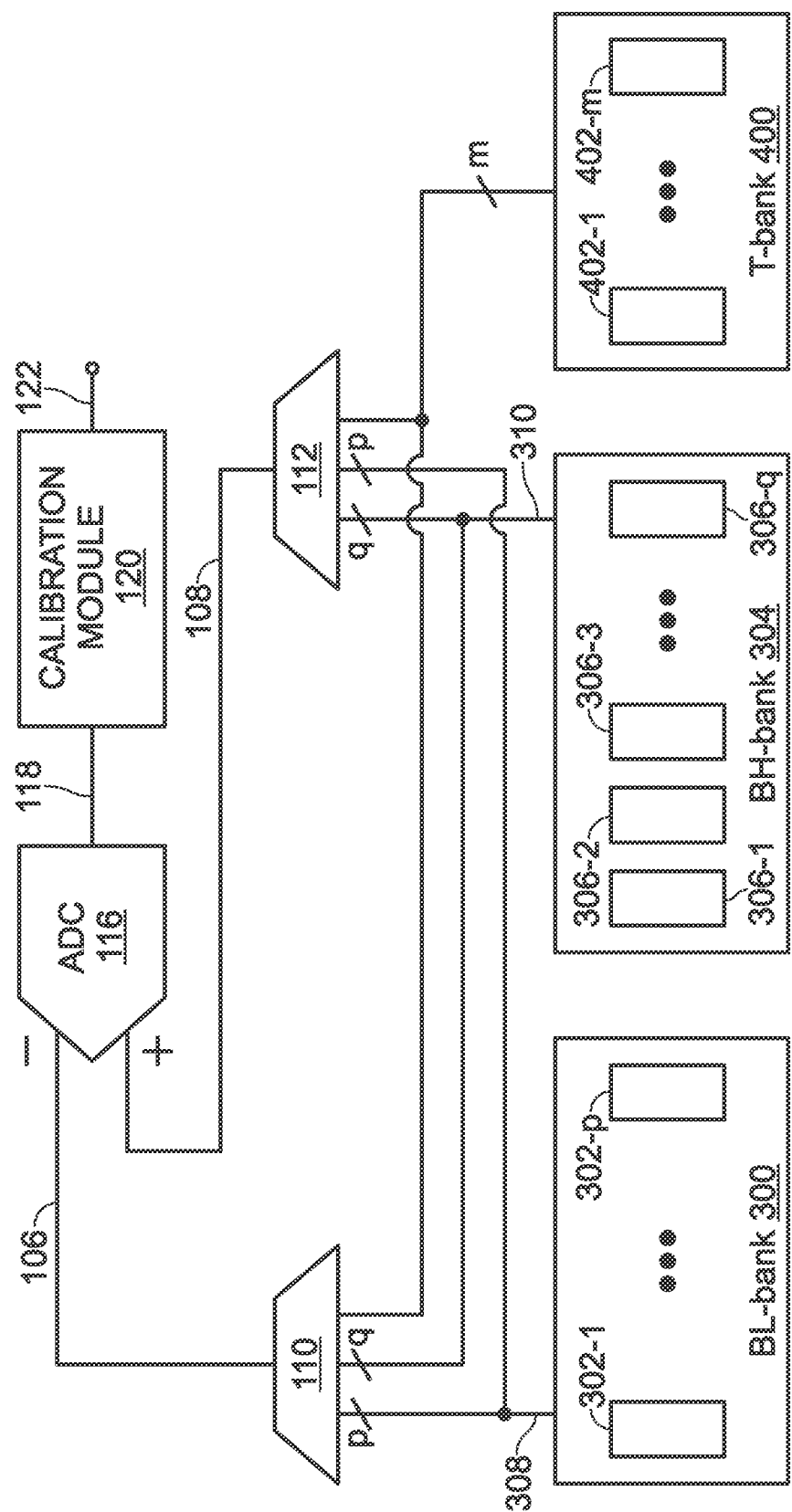
FIG. 4 is a schematic block diagram depicting a third variation of the system of FIG. 1.

FIG. 4 is a schematic block diagram depicting a third variation of the system of FIG. 1. This aspect includes a thermometer bank (T-bank) 400 of m current sources (402-1 through 402-m), where each current source in the T-bank has a nominal nth digital value. To continue the example of FIG. 3, the qth current source 306-q of the BH-band 304 has the nominal nth digital value. Then, current source 306-q can be compared to each current source in the T-bank to determine the differences between the actual and nominal T-bank current source measurements.

Figure 5:
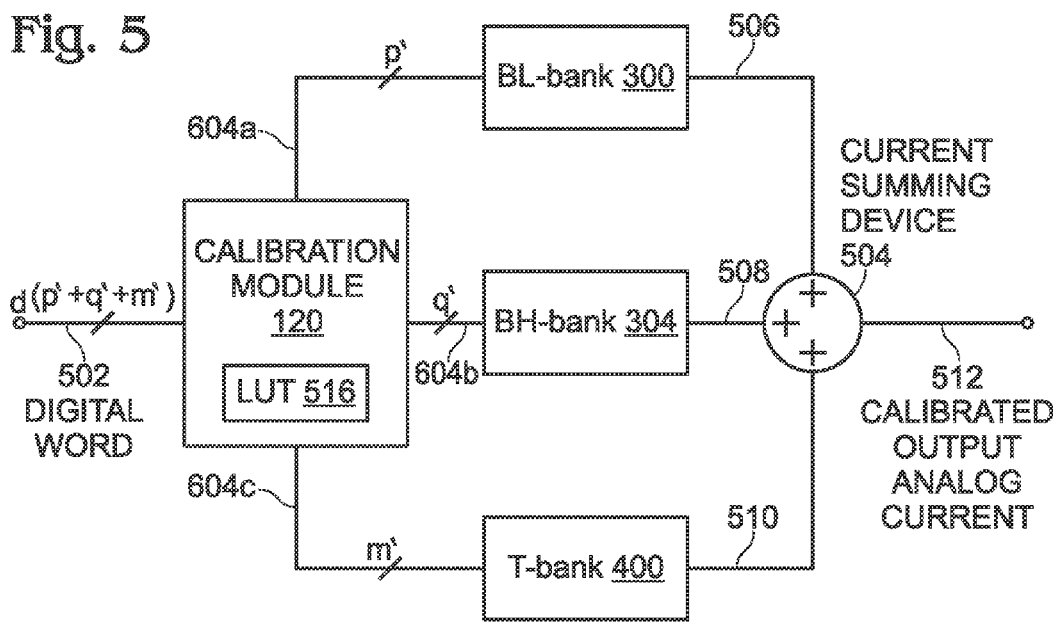
FIG. 5 is a schematic block diagram depicting aspects of the current source measuring system used in a digital-to-analog converter (DAC).

FIG. 5 is a schematic block diagram depicting aspects of the current source measuring system used in a digital-to-analog converter (DAC). The DAC has an input interface on line 502 accepting a digital word comprising (p'+q'+m') digits, and having an input digital word value. For example, any combination of the p current sources in the BL-bank can be represented by p' binary digits, any combination of the q current sources in the BH-bank can be represented by q' binary digits, and any combination of m current sources in the T-bank can be represented by m' binary digits. A current summing device 504 has inputs on lines 506, 508, and 510 to accept current from a combination of current sources from the BL-bank 300, BH-bank 304, and T-bank 400 having an adjusted digital word value, as opposed to nominal value, equal to the input digital word value. Alternatively stated, the adjusted digital word value supplied on lines 604a, 604b, and 604c is a modification of the input digital word value, modified to account for inaccuracies in the nominal values of the current sources. Such a task might be performed by calibration module 120, working in conjunction with a calibration engine and look-up table (LUT) 516 of actual current source values. As explained in more detail below, instead of storing actual current source values it is advantageous to store differences between actual and nominal current source values. The current summing device 504 has an output interface on line 512 to supply a calibrated output analog current.

Figure 6A:
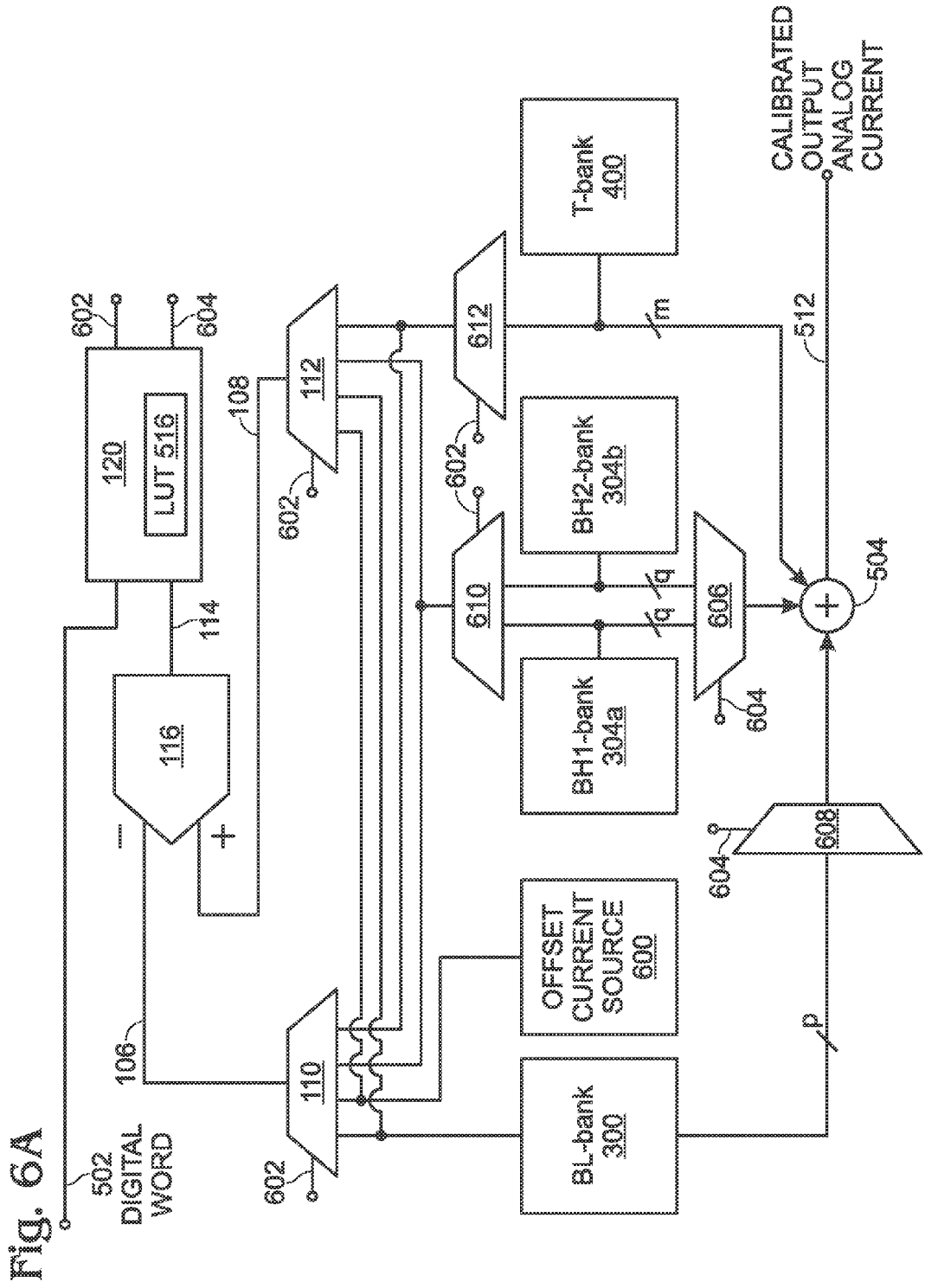
FIG. 6A is a schematic block diagram depicting a variation where calibration corrections are applied in the analog domain.

FIG. 6A is a schematic block diagram depicting a variation where calibration corrections are applied in the analog domain. In this aspect, the system comprises an offset current source 600 having the reference first digital value. Thus, unlike the system of FIG. 4, current source 302-p of the BL-bank is not required as a reference. Instead of a single BH-bank, this system comprises a first higher bank (BH1-bank) 304a of q current sources having corresponding consecutively increasing nominal digital values beginning with the first digital value nominally equal to the reference first digital value. The system also comprises a second higher bank (BH2-bank) 304b of q current sources having corresponding consecutively increasing nominal digital values beginning with the first digital value nominally equal to the reference first digital value. Further, the T-bank 400 includes (m+1) current sources each having the nominal nth digital value. Between the BL-bank 300, one of the BH-banks, and m current sources from the T-bank, the DAC has a sufficient number of available current sources to convert any digital word of (p'+q'+m') bits into an analog value, while maintaining the capability of calibrating current sources in the other BH-bank and one of the current sources from the T-bank in the background.

For example, the current summing device 504 may accept current from the BL-bank 300, the BH1-bank 304a, and m current sources from the T-bank 400 to form the calibrated output analog current equal to the input digital word value. The connections necessary to supply these current sources are represented through the use of MUXs 606 and 608, as might be enabled through control signals on line 604 supplied by the calibration module 120. Simultaneously with the current summing device 504 supplying the calibrated output analog current, the subtraction device (i.e. differential input ADC) 116 subtracts combinations of the offset current source 600, BH2-bank 304b current sources, and one selectively rotated current source from the T-bank 400. The connections necessary to supply these current sources is represented through the use of MUXs 110, 112, 610, and 612, as might be enabled through control signals on line 602 supplied by the calibration module 120. In this manner, the calibration module 120 adjusts current source nominal values in the BH2-bank 304b and the selected current source in the T-bank 400 in the background, as the calibrated output analog current is being supplied by the current summing device 504. Once the current sources in BL2-bank 304b are calibrated, this bank can be used to convert input digital values to output analog currents while BH1-bank 304a is calibrated in the background.

Figure 6B:
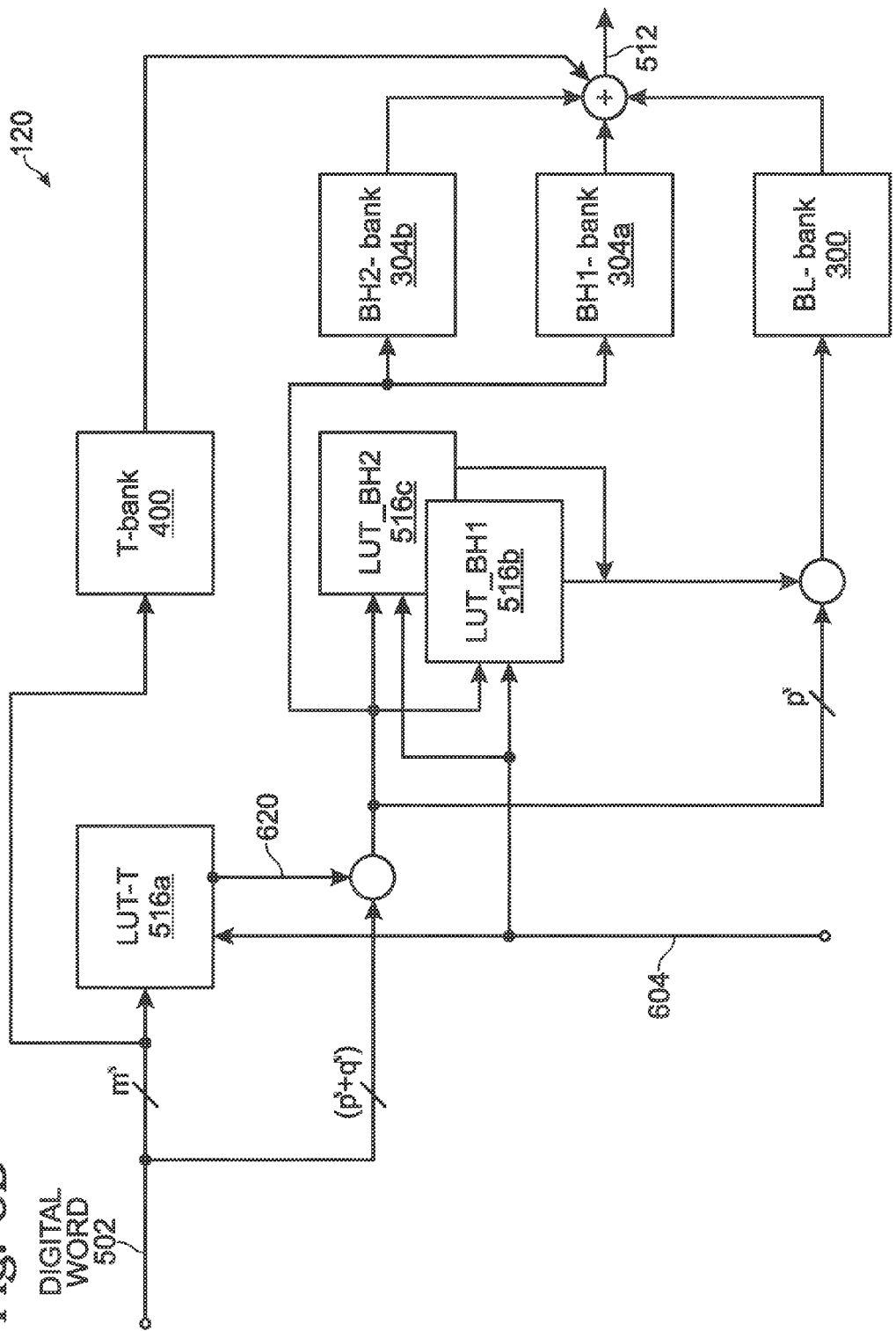
FIG. 6B is a simplified schematic block diagram of the DAC system where calibration corrections are applied in the digital domain.

FIG. 6B is a simplified schematic block diagram of the DAC system where calibration corrections are applied in the digital domain. The calibration module 120 comprises a first look-up table (LUT-T) 516a having an input on line 512 to accept the m' most significant bits of the input digital word and an output on line 620 connected to adjust the digital value of the (p'+q') most significant bits of the input digital word. A second LUT, either LUT-BH1 516b or LUT-BH2 516c, depending on which BH-bank is being calibrated, has an input to accept the (p'+q') most significant bits of the input digital word and an output connected to adjust the digital value of the p' most significant bits of the input digital word. Then, assuming the BH2-bank 304b is being calibrated, the BH1-bank 304a supplies an analog output current responsive to the adjusted digital value of the (p'+q') most significant bits of the input digital word. The BL-bank 300 supplies an analog output current responsive to the adjusted digital value of the p' most significant bits of the input digital word. As explained in more detail below, control signals on line 604 update the LUTs. In other words, corrections to the T-bank currents sources are applied to the (p'+q') more significant digits of the input digital word associated with the BH-bank, while corrections to the BH-bank current sources are applied to the p' most significant digits in the input digital word associated with the BL-bank.

Figure 8:
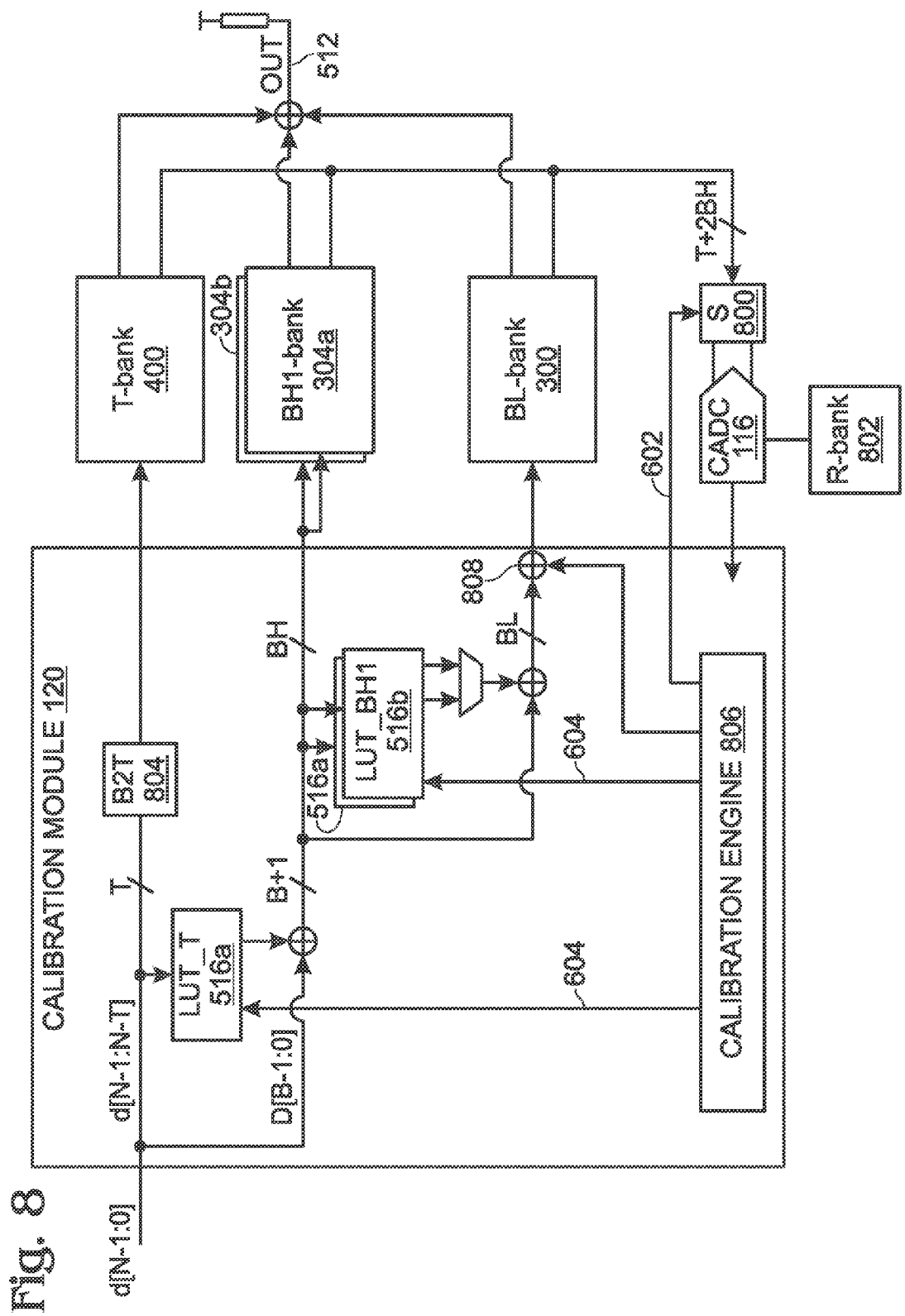
FIG. 8 is a schematic block diagram depicting a more detailed description of the system of FIG. 6B.

FIG. 8 is a schematic block diagram depicting a more detailed description of the system of FIG. 6B. The current sources are segmented into 3 groups: thermometer current sources (T-bank 400), most significant bit current sources (BH-banks 304a and 304b, binary weighted), and least significant bit current sources (BL-bank 300, binary weighted).

LUTs store the calibration codes calculated by the calibration engine (CE) 806 and supplied on line 604. The calibration codes are added to the digital input data, d[N−1:0], to form the calibrated data. In this example, the input digital word is comprised of N binary digits. As shown, the LUT may be split into multiple LUTs: the thermometer LUT 516a (LUT_T), and the binary LUTs, LUT_BH1 516b and LUT_BH2 516c. The former stores the correction codes for the T-bank while the latter two store the correction codes for the BH-banks. Binary-to-thermometer decoder 804 (B2T) transforms the binary-encoded digital input value to a thermometer-encoded value. A thermometer code may be represented as a (positive) natural number, n, with up to n number of ones. For example, in an 8-bit thermometer code, number zero is represented by zero ones; the number one is represented by 1 one; number two is represented by 2 ones, etc.

0 00000000
1 00000001
2 00000011
3 00000111
4 00001111
5 00011111
6 00111111
7 01111111
8 11111111

The digital input data is N-bit wide, where N=(p'+q'+m'). T MSBs of the digital input data, d[N−1:N−T], are used to address the T-bank current sources, after proper binary-to-thermometer encoding. The remaining B LSBs of the digital input data, d[B−1:0], where B=(N−T), are further split into two busses BH-bit wide and BL-bit wide and are used to address the BH- and BL-bank current sources. The LUT_T calibration codes are added to the BH bits addressing the BH-bank; while the LUT_BH calibration codes are added to the BL bits addressing the BL-bank.

The BL-bank 300 is formed by BL binary-scaled current sources, i.e. if BL=6, the current sources are 1, 2, 4, 8, 16, and 32. The total current is therefore 63. The BH-banks are formed by BH binary-scaled current sources, i.e. if BH=5, the current sources are 32, 64, 128, 256, and 512. The T-bank is formed by $2^T-1$ unary-scaled current sources, i.e. if T=6, there are 63 current sources whose value is 1024.

The 32-sized current source of the BL-bank "overlaps" with the 32-sized current source of the BH-bank. This redundancy provides a calibration range of ±16 codes. The BH-bank also includes one extra 512 current source, to enable a calibration range of ±256 codes for the T-bank.

This architecture enables a foreground calibration where the current sources are measured with a calibration ADC (CADC) before the DAC is in operation mode. A current select-and-add (S) 800, controlled by the CE 120, is used at the input of the CADC 116. Note: the select-and-add module 800 performs a function similar to the MUXs (110, 112) depicted in FIG. 4. The CADC 116 can be implemented, for example, as a delta-sigma ADC followed by a decimation filter (DEC). Chopper stabilization can be used to reduce offset.

In order to enable background calibration, the T-bank includes one extra current source, while the BH-bank is split into 2 identical banks, the BH1-bank 304a and BH2-bank 304b. All the current sources in the T-bank 400, BH1-bank 304a, and BH2-bank 304b are measured using the CADC 116, while the BL-bank 300 is not calibrated.

During the measurement of the T-bank current sources, one current source is switched to the calibration output and sent to the CADC. The extra current source enables the background calibration by always leaving $2^T-1$ available unary current sources.

In one aspect, the BL-bank is also matched to a reference bank (R-bank) 802, a scale bank (S-bank, not shown), and an offset bank, all of size 32 (as an example from the abovementioned partitioning). The R-bank 802 is used as reference for the CADC 116. All the calibration measurements are relative to this current source. The S-bank enables an indirect calibration of the BL-bank.

The offset bank enables the reduction of the dynamic range of the CADC: a "difference current" is measured instead of the total current of the current source. In this case, the CADC can have lower resolution than the DAC.

The CE 120 selects the current source to be measured. The offset current source is measured first. The measured value is stored and used to calculate the correction codes (see below). Then, the first current source in the BH-bank, of size 32 from the abovementioned example, is selected for the positive input of the CADC, while the offset current source is selected for the negative input. The difference between these two currents is stored.

Next, the second current source, of size 64 from the abovementioned example, is selected for the positive input of the CADC, while the offset current source plus the first current source in the BH-bank, of size 32 from the abovementioned example, are selected for the negative input. Again, the difference between these two currents is stored. All the current sources are measured against the sum of the current of the lower bits plus the offset. Finally, all the current sources in the T-bank are measured against the sum of the MSB current sources in the BH-bank.

As noted above, current source combinations and comparisons may be enabled in the form of control signals on line 602. The CE 806 also calculates differences between current source nominal values and the digital difference values, and supplies the adjusted current source nominal values on line 604. Knowing the adjusted current nominal values, which might also be referred to as the difference between the nominal and actual current source values, a modification to the input digital word can be made that supplies a calibrated analog output current equal to the input digital word.

In one aspect a scaler 808 accepts the adjusted digital value of the BL (p'+q') most significant digits (bits) of the input digital word and multiplies this value by a scaling coefficient proportional to the difference between the average of the T-bank current source error values, and the reference current source. These scaled adjusted digital values are then supplied to the BL-bank.

Figure 7:
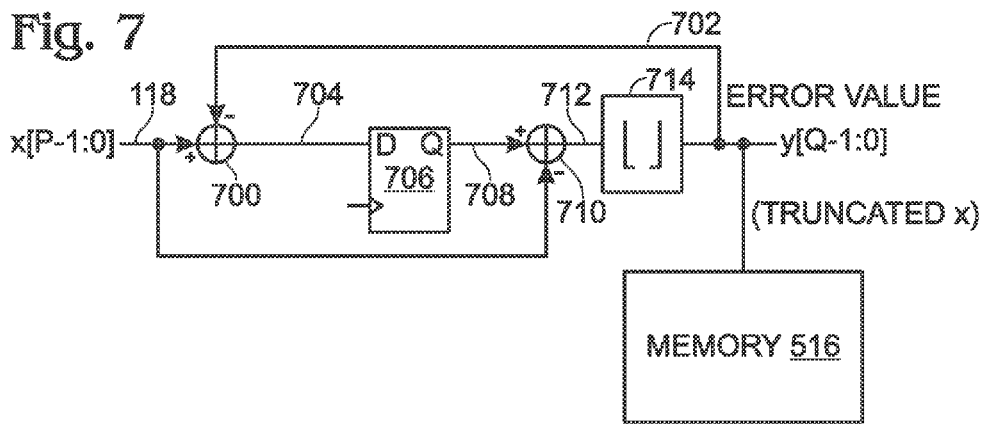
FIG. 7 depicts additional details of an exemplary calibration module.

FIG. 7 depicts additional details of an exemplary calibration module. In this aspect, the calibration module comprises a first subtraction module 700 having an input on line 118 to accept the digital difference value from the ADC and an input on line 702 to accept a previously generated error value. The first subtraction module 700 has an output to supply a first result on line 704, which is the subtraction of the previously generated error value from the digital difference value. In this example, the digital difference value is a p-bit digital word. To ensure correct timing, the first result may be gated through flip-flop 706 and supplied on line 708. A second subtraction device 710 has an input on line 708 to accept the first result and an input on line 118 to accept the digital difference value. The second subtraction module 710 subtracts the digital difference value from the first result to supply a second result on line 712. A truncation module 714 accepts the second result on line 712 and supplies a truncated second result on line 702, which is the current error value. A memory or look-up table(s) 516 stores the errors following a consecutive order of current source nominal values. Alternatively stated, the digital difference values are supplied following a consecutive order of current source values that may be either ascending or descending in order. The error values may also be referred to as the above-mentioned adjusted current source nominal values.

FIG. 9 is a flowchart illustrating the DAC calibration process. The process starts at Step 900. In Step 902 the offset current is measured, as follows:

$$\hat{b}_0 = b_0 + \Delta b_0$$

$$\Delta \hat{b}_0 = \Delta b_0 = \hat{b}_0 - \text{reference} \quad (1)$$

where $\hat{b}_0$ is the measured current for the offset, $b_0$ is the ideal current source magnitude for the offset, and $\Delta b_0$ is the error due to mismatch.

In Step 904 the difference currents in the BH-bank are measured, as follows:

$$\hat{b}_{h0} = b_{h0} + \Delta b_{h0}$$

where $\hat{b}_{h0}$ is the measured LSB current in the BH-bank, $b_{h0}$ is the ideal current source magnitude for the LSB current in the BH-bank, and $\Delta b_{h0}$ is the error due to mismatch in the LSB current in the BH-bank.

Step 906 measures BH-bank errors, as follows:

$$\Delta \hat{b}_{h0} = \hat{b}_{h0} - \hat{b}_0 = b_{h0} + \Delta b_{h0} - b_0 - \Delta b_0 = \Delta b_{h0} - \Delta \hat{b}_0 \quad (2a)$$

As $b_{h0} = b_0$ by design, eq. (2a) can be reduced to:

$$\Delta b_{h0} = \Delta \hat{b}_{h0} + \Delta \hat{b}_0 \quad (2)$$

Using the same reasoning, the BH-bank errors can be calculated as follows:

$$\Delta b_{h1} = \Delta \hat{b}_{h1} + \Delta \hat{b}_{h1} + 2\Delta \hat{b}_0 \quad (3)$$

$$\Delta b_{h4} = \Delta \hat{b}_{h4} + \Delta \hat{b}_{h3} + 2\Delta \hat{b}_{h2} + 4\Delta \hat{b}_{h0} + 8\Delta \hat{b}_{h0} + 16\Delta \hat{b}_0 \quad (4)$$

$$\Delta b_{h3} = \Delta \hat{b}_{h3} + \Delta \hat{b}_{h2} + 2\Delta \hat{b}_{h1} + 4\Delta \hat{b}_{h0} + 8\Delta \hat{b}_0 \quad (5)$$

$$\Delta b_{hk} = \Delta \hat{b}_{hk} + \Delta \hat{b}_{h(k-1)} + 2\Delta \hat{b}_{h(k-3)} + 2^2 \Delta \hat{b}_{h(k-3)} + \ldots + 2^k \Delta \hat{b}_0 \quad (6)$$

where k is the number of bits in the BH-bank segment.

In Step 908 the T-bank current sources are measured in an analogous manner. In Step 910 the T-bank current sources mismatch can be calculated. First, the extra MSB current source error, $\Delta b_{msb}$, in the BH-bank must be measured as in eq. (6):

$$\Delta b_{msb} = \Delta b_{hk} = \Delta \hat{b}_{hk} + \Delta \hat{b}_{h(k-1)} + 2\Delta \hat{b}_{h(k-2)} + 2^2 \Delta \hat{b}_{h(k-3)} + \ldots + 2^k \Delta \hat{b}_0$$

then $$\Delta t_n = \Delta \hat{t}_n + \Delta \hat{b}_{hk} + \Delta b_{msb} \quad (7)$$

where n is the nth thermometer current source in the T-bank. The errors in eq. (2)-(7) can be then stored in the LUT.

The measured differences are processed by the calibration engine (CE) to determine the error of each current source and are stored in a look-up table (LUT).

Step 912 calculates the average of the $\Delta T_n$ errors. In Step 914 error-feedback modulation is applied to reduce the size of the look-up tables. In Step 916 a decision is made as to which BH-bank is the calibrated. In Steps 918 and 920, the results from the calibration engine are stored into the look-up tables. If LUT_BHA is being used in the data path and, therefore, the BHA-bank current sources, the data is stored in the LUT_BHB for the BHB-bank. In Step 922 the calibration engine stores the results for LUT_T. In Step 924, the current source banks are switched. If BHA and LUT_BHA was previously being used, now BHB and LUT_BHB are used. Every time a calibration cycle is finished, the BH-banks are toggled. In Step 926 the process returns to the start.

Returning to FIG. 7, an error-feedback modulator (EFM) process may be used to reduce the size of the LUT and optimize the sum of the correction codes. Other methods can be implemented, for example, the least mean square method. In a current-steering DAC, the thermometer partition of the current sources is always used in the same sequence, i.e. if 3 MSB sources are to be represented, sources $T_1$, $T_2$ and $T_3$ are added them together, and if 27 MBS sources are needed, sources $T_1$, $T_2$, ... and $T_{27}$ are added together.

For example, assuming a T-bank with eight source current sources:

$T_1 = 44481$
$T_2 = 49659$
$T_3 = 48701$
$T_4 = 25704$
$T_5 = 42957$
$T_6 = 11218$
$T_7 = 46271$
$T_8 = 2086$

If these values are truncated (floor operation), residual errors exist of 0.5078, 0.9609, 0.4766, 0.8125, 0.6016, 0.6406, 0.4922, and 0.2969, respectively. The total accumulated error is 0.5078, 1.4688, 1.9453, 2.7578, 3.3594, 4.0000, 4.4922, and 4.7891 (adding all the residual errors together incrementally). The EFM produces the following sequence: 0.5078, −0.0391, 0.4766, −0.1875, 0.6016, −0.3594, 0.4922, and 0.2969, keeping the total accumulated error between ±1 codes.

In another explanation of truncation, the decimal number D=0.23456 is represented with a 16-bit word, B16. To do so: B16=floor(2^16*D). The floor operation returns the largest previous integer, e.g., floor(4.2)=4 or floor(8.99)=8. In this case: B16=floor(2^16*0.23456)=floor(15372.12416)=15372. Therefore, 15372 is the 16-bit representation of 0.23456. In doing so, an error of 0.12416 bits is made. This error is due to the quantization process. If D is represented with a 10-bit number, the same procedure yields B10=floor(2^10*0.23456)=240. The error is 0.1894 bits.

The same result can be achieved by taking the 16-bit number, in binary representation 0011110000001100, and dropping the last six bits, i.e., 0011110000. This is called truncation.

A sequence of numbers represented as 16-bit words can be truncated to 10 bits, each having an error between 0 and 0.999 ... (all positive errors). When all these errors are added together, the sum is very large. When EFM is used however, the next number is truncated knowing what error made after truncating the previous number, so that the sum of all the errors is minimized. The EFM method keeps the sum of all the errors bound between +/−1.

Figure 10B:
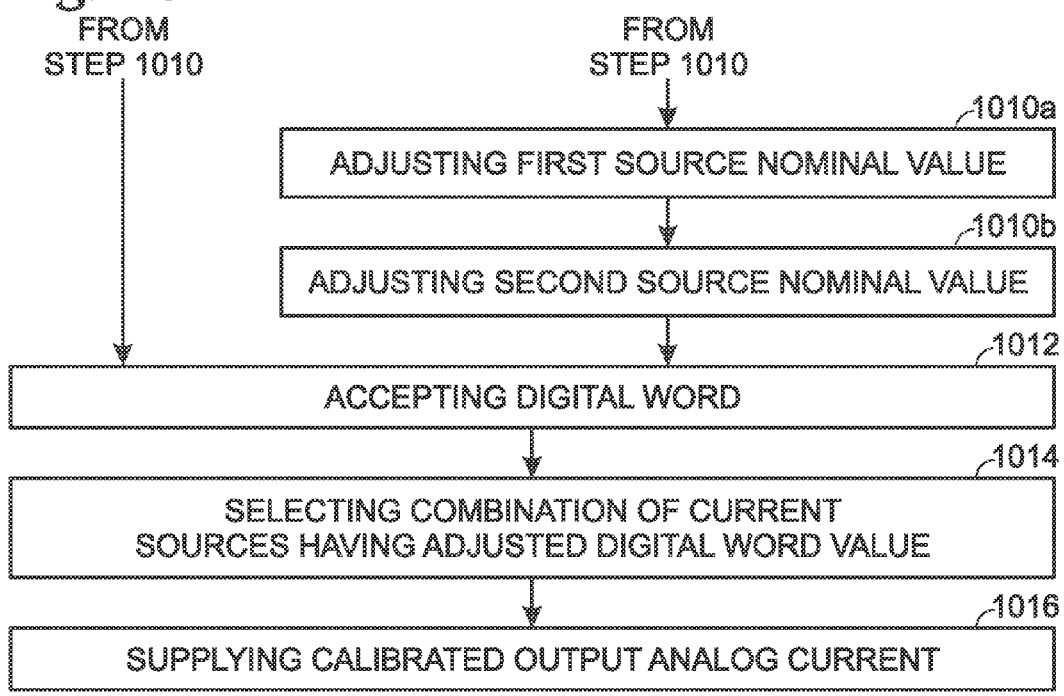

FIGS. 10A and 10B are a flowchart illustrating a method for measuring current sources. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 1000.

Step 1002 provides a first plurality of current sources, each current source engageable to supply a current representing a corresponding nominal value. Step 1004 selectively enables current source combinations of current. Step 1006 measures the current source combinations of current. In response to measuring the current source combinations, Step 1008 finds current difference values. Step 1010 adjusts the current source nominal values using the current difference values.

In one aspect, Step 1001 provides a reference current source having a reference first value. Then, measuring current source combinations in Step 1006 includes comparing at least a first current source to the reference current source. Adjusting the current source nominal values with respect to the current difference values in Step 1010 includes adjusting the current source nominal values with respect to the reference first value.

In another aspect, Step 1002 provides current sources with corresponding nominal digital values. Then, finding the current difference values in Step 1008 includes converting the current difference values into digital difference values, and Step 1010 adjusts the current source nominal digital values using the digital difference values.

In one aspect, Step 1002 provides a lower bank of p current sources (BL-bank) having corresponding consecutively increasing reference digital values ending with a pth current source, which has a reference first digital value. Step 1002 also provides a higher bank of q current sources (BH-bank) having corresponding consecutively increasing nominal digital values beginning with a first digital value nominally equal to the reference first digital value. Then, measuring current source combinations in Step 1006 includes substeps. In a first comparison, Step 1006*a* compares the pth current source in the BL-bank to a first current source in the BH-bank having the nominal first digital value. In a second comparison, Step 1006*b* compares a combination of (the pth current source and the first current source) to a second current source in the BH-bank having a second digital value nominally equal to (the reference first digital value and the nominal first digital value).

Finding the current difference values in Step 1008 includes substeps. Step 1008*a* finds a first digital difference in response to the first comparison. Step 1008*b* finds a second digital difference in response to the second comparison. Finally, Step 1010*a* adjusts the nominal digital value of the first current source in response to the first digital difference, and Step 1010*b* adjusts the nominal digital value of the second current source in response to the first and second digital differences.

In another variation, Step 1002 provides a thermometer bank (T-bank) including of m current sources, where each current source in the T-bank has a nominal nth digital value. Further, Step 1002 may provide the BH-band of current sources with a qth current source having the nominal nth digital value. This variation accords with the system of FIG. 5.

Further steps in the method may include the following. Step 1012 accepts a digital word comprising (p'+q'+m') digits having an input digital word value. Step 1014 selects a combination of current sources from the BL-bank, BH-bank, and T-bank having an adjusted digital word value equal to the input digital word value. Step 1016 supplies a calibrated output analog current.

To further the example, Step 1002 may provide an offset current source having the reference first digital value. Step 1002 may provide a first higher bank of q current sources (BH1-bank) having corresponding consecutively increasing nominal digital values beginning with the first digital value nominally equal to the reference first digital value. In addition, Step 1002 may provide a second higher bank of q current sources (BH2-bank) having corresponding consecutively increasing nominal digital values beginning with the first digital value nominally equal to the reference first digital value. Also, the T-bank may include (m+1) current sources, each having the nominal nth digital value. This variation accords with the system depicting in FIG. 6A or 6B.

Then, selecting the combination of current sources having the adjusted digital word value in Step 1014 includes selecting current sources from the BL-bank, the BH1-bank, and m current sources from the T-bank to form the calibrated output analog current equal to the input digital word value. Comparing the current source combinations in Step 1006 includes, simultaneously with forming the calibrated output analog current in Step 1016, comparing combinations of the offset current source, BH2-bank current sources, and one selectively rotated current source from the T-bank. Then, adjusting the current source nominal values in Step 1010 includes adjusting current source nominal values in the BH2-bank and the selected current source in the T-bank in the background, as the calibrated output analog current is being supplied in Step 1016.

In one aspect, converting the current difference values into digital difference values in Step 1008 includes other substeps. Step 1008*c*, following a consecutive order of current source nominal values, subtracts a previously generated error value from a current digital difference value to form a first result. Step 1008*d* finds a difference between the current digital difference value and the first result to form a second result. Step 1008*e* truncates the second result to form a current error value, and Step 1008*f* records the error values. See FIG. 7.

Figure 11:
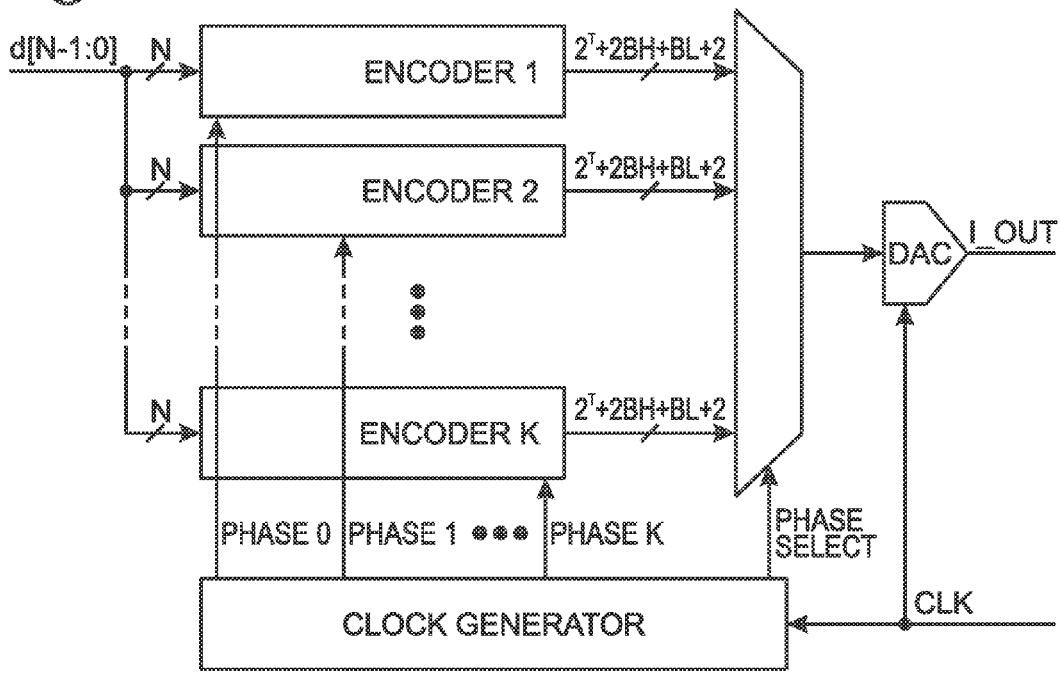
FIG. 11 is a schematic block diagram depicting another variation of the DAC with calibration system.

FIG. 11 is a schematic block diagram depicting another variation of the DAC with calibration system. In order to enable high-speed operation, the encoder is parallelized into K identical paths, clocked with 1/K of the DAC rate. Each clock signal is also delayed by $2\pi/K$, to prevent clock leakage into the DAC output at fs/K. A K-to-1 multiplexer selects the data path provided to the DAC.

Figure 12:
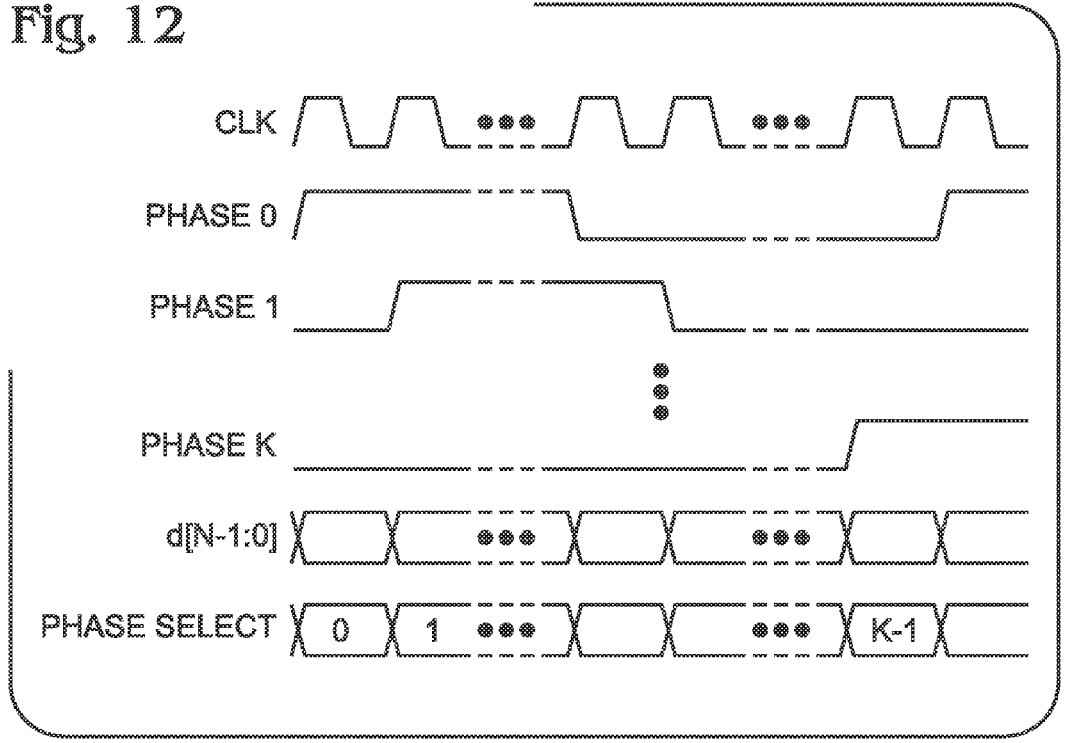
FIG. 12 is an exemplary timing diagram associated with the system of FIG. 11.

FIG. 12 is an exemplary timing diagram associated with the system of FIG. 11.

A system and method have been provided for measuring and calibrating current sources, such as might be useful in a DAC. Examples of particular current source groups, combination hardware, and storage algorithms have been presented to illustrate the invention. However, the invention is not limited to merely these examples. Other variations and embodiments of the invention will occur to those skilled in the art.

We claim:

1. A method for measuring current sources, the method comprising:
   providing a first plurality of current sources, each current source engageable to supply a current representing a corresponding nominal value, including a reference current source having a reference first value;
   selectively enabling current source combinations of current;

measuring the current source combinations of current by comparing at least a first current source to the reference current source;

in response to measuring the current source combinations, finding current difference values; and, adjusting the current source nominal values with respect to the reference first value using the current difference values.

2. The method of claim 1 wherein providing the current sources includes providing current sources with corresponding nominal digital values;

wherein finding the current difference values includes converting the current difference values into digital difference values; and, wherein adjusting the current source nominal values with respect to the current difference values includes adjusting the current source nominal digital values using the digital difference values.

3. The method of claim 2 wherein converting the current difference values into digital difference values includes:

following a consecutive order of current source nominal values, subtracting a previously generated error value from a current digital difference value to form a first result;

finding a difference between the current digital difference value and the first result to form a second result;

truncating the second result to form a current error value;

recording the error values.

4. The method of claim 2 wherein providing the plurality of current sources includes providing:

a lower bank of p current sources (BL-bank) having corresponding consecutively increasing reference digital values ending with a pth current source having a reference first digital value; and, a higher bank of q current sources (BH-bank) having corresponding consecutively increasing nominal digital values beginning with a first digital value nominally equal to the reference first digital value.

5. The method of claim 4 wherein measuring current source combinations includes:

in a first comparison, comparing the pth current source in the BL-bank to a first current source in the BH-bank having the nominal first digital value;

in a second comparison, comparing a combination of (the pth current source and the first current source) to a second current source in the BH-bank having a second digital value nominally equal to (the reference first digital value and the nominal first digital value);

wherein finding the current difference values includes:

finding a first digital difference in response to the first comparison;

finding a second digital difference in response to the second comparison;

wherein adjusting the current source nominal values using the current difference values includes:

adjusting the nominal digital value of the first current source in response to the first digital difference; and, adjusting the nominal digital value of the second current source in response to the first and second digital differences.

6. The method of claim 4 wherein providing the plurality of current sources includes providing a thermometer bank (T-bank) including m current sources, where each current source in the T-bank has a nominal nth digital value.

7. The method of claim 6 wherein providing the BH-band of current sources includes the qth current source having the nominal nth digital value.

8. The method of claim 7 further comprising:

accepting a digital word having an input digital word value;

selecting a combination of current sources from the BL-bank, BH-bank, and T-bank having an adjusted digital word value equal to the input digital word value; and, supplying a calibrated output analog current.

9. The method of claim 8 wherein providing the plurality of current sources includes providing:

an offset current source having the reference first digital value;

a first higher bank of q current sources (BH1-bank) having corresponding consecutively increasing nominal digital values beginning with the first digital value nominally equal to the reference first digital value;

a second higher bank of q current sources (BH2-bank) having corresponding consecutively increasing nominal digital values beginning with the first digital value nominally equal to the reference first digital value; and, wherein the T-bank includes (m+1) current sources each having the nominal nth digital value.

10. The method of claim 9 wherein selecting the combination of current sources having the adjusted digital word value includes selecting current sources from the BL-bank, the BH1-bank, and m current sources from the T-bank to form the calibrated output analog current equal to the input digital word value;

wherein comparing the current source combinations includes, simultaneously with forming the calibrated output analog current, comparing combinations of the offset current source, BH2-bank current sources, and one selectively rotated current source from the T-bank; and, wherein adjusting the current source nominal values includes adjusting current source nominal values in the BH2-bank and the selected current source in the T-bank in the background, as the calibrated output analog current is being supplied.

11. A system for measuring current sources, the system comprising:

a first plurality of current sources, each current source engageable to supply a current representing a corresponding nominal value, including a reference current source having a reference first value;

a subtraction device having inputs selectively connected to the current sources and an output to supply combination current difference values;

a current measurement device having an input to accept the combination current difference values and an output to supply current difference value measurements; and, a calibration module having an input to accept the current difference value measurements and an output to supply adjusted current source nominal values in response to the current difference value measurements;

wherein the current measurement device compares at least a first current source to the reference current source; and, wherein the calibration module adjusts the current source nominal values with respect to the reference first value.

12. The system of claim 11 wherein the current sources have corresponding nominal digital values;

wherein the current measurement device is an analog-to-digital converter (ADC) converting the current difference value measurements into digital difference values; and, wherein the calibration module adjusts the current source nominal digital values using the digital difference values.

13. The system of claim 12 wherein the plurality of current sources includes:
a lower bank of p current sources (BL-bank) having corresponding consecutively increasing reference digital values ending with a pth current source having a reference first digital value; and,
a higher bank of q current sources (BH-bank) having corresponding consecutively increasing nominal digital values beginning with a first digital value nominally equal to the reference first digital value.

14. The system of claim 13 wherein the subtraction device subtracts the pth current source in the BL-bank from a first current source in the BH-bank having the nominal first digital value in a first comparison, and in a second comparison, subtracts a combination of (the pth current source and the first current source) from a second current source in the BH-bank having a second digital value nominally equal to (the reference first digital value and the nominal first digital value);
wherein the ADC supplies a first digital difference in response to the first comparison, and supplies a second digital difference in response to the second comparison; and,
wherein the calibration module adjusts the nominal digital value of the first current source in response to the first digital difference, and adjusts the nominal digital value of the second current source in response to the first and second digital differences.

15. The system of claim 13 wherein the plurality of current sources includes a thermometer bank (T-bank) including m current sources, where each current source in the T-bank has a nominal nth digital value.

16. The system of claim 15 wherein the BH-band of current sources includes the qth current source having the nominal nth digital value.

17. The system of claim 16 further comprising:
an input interface accepting a digital word comprising (p'+q'+m') digits having an input digital word value; and,
a current summing device having inputs to accept current from a combination of current sources from the BL-bank, BH-bank, and T-bank having an adjusted digital word value equal to the input digital word value, and an output interface to supply a calibrated output analog current.

18. The system of claim 17 wherein the plurality of current sources includes:
an offset current source having the reference first digital value;
a first higher bank of q current sources (BH1-bank) having corresponding consecutively increasing nominal digital values beginning with the first digital value nominally equal to the reference first digital value;
a second higher bank of q current sources (BH2-bank) having corresponding consecutively increasing nominal digital values beginning with the first digital value nominally equal to the reference first digital value; and,
wherein the T-bank includes (m+1) current sources each having the nominal nth digital value.

19. The system of claim 18 wherein the current summing device accepts current sources from the BL-bank, the BH1-bank, and m current sources from the T-bank to supply the calibrated output analog current equal to the input digital word value;
wherein the subtraction device, simultaneously with the current summing device supplying the calibrated output analog current, subtracts combinations of the offset current source, BH2-bank current sources, and one selectively rotated current source from the T-bank; and,
wherein the calibration module adjusts current source nominal values in the BH2-bank and the selected current source in the T-bank in the background, as the calibrated output analog current is being supplied by the current summing device.

20. The system of claim 19 wherein the calibration module comprises:
a first look-up table (LUT) having an input to accept the m' most significant bits of the input digital word and an output connected to adjust the digital value of the (p'+q') most significant bits of the input digital word;
a second LUT having an input to accept the (p'+q') most significant bits of the input digital word and an output connected to adjust the digital value of the p' most significant bits of the input digital word;
wherein the BH1-bank supplies an analog output current responsive to the adjusted digital value of the (p'+q') most significant bits of the input digital word; and,
wherein the BL-bank supplies an analog output current responsive to the adjusted digital value of the p' most significant bits of the input digital word.

21. The system of claim 19 wherein the calibration module includes:
a first subtraction module having inputs to subtract a previously generated error value from a current digital difference value, and an output to supply a first result;
a second subtraction module having inputs to subtract the current digital difference value from the first result, and an output to supply a second result;
a truncation device to accept the second result, the truncation device truncating the second result to supply a current error value; and,
a memory to store the errors values following a consecutive order of current source nominal values.

22. The system of claim 21 further comprising:
a scaler having a first input to accept adjusted digital values for the p' most significant digits of the input digital word and a second input to accept a scaling coefficient proportional to a difference between an average of T-bank current source error values and the reference current source, the scaler multiplying the first input by the second input to supply scaled adjusted digital values to the BL-bank.

* * * * *

UNITED STATES PATENT AND TRADEMARK OFFICE
CERTIFICATE OF CORRECTION

| | | |
|---|---|---|
| PATENT NO. | : 9,035,810 B1 | Page 1 of 1 |
| APPLICATION NO. | : 14/602095 | |
| DATED | : May 19, 2015 | |
| INVENTOR(S) | : Mikko Waltari et al. | |

It is certified that error appears in the above-identified patent and that said Letters Patent is hereby corrected as shown below:

In the specification,

In Column 9, at line 52, formula 6 has been incorrectly printed. The formula should read as follows:

$$\Delta b_{hk} = \Delta \hat{b}_{hk} + \Delta \hat{b}_{h(k-1)} + 2\Delta \hat{b}_{h(k-2)} + 2^2 \Delta \hat{b}_{h(k-3)} + \ldots + 2^k \Delta \hat{b}_0 \quad (6)$$

Signed and Sealed this
Twenty-first Day of June, 2016

Michelle K. Lee
*Director of the United States Patent and Trademark Office*